(12) United States Patent
Horii et al.

(10) Patent No.: US 8,802,552 B2
(45) Date of Patent: Aug. 12, 2014

(54) METHOD FOR MANUFACTURING SEMICONDUCTOR DEVICE

(75) Inventors: Taku Horii, Osaka (JP); Takeyoshi Masuda, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 13/546,828

(22) Filed: Jul. 11, 2012

(65) Prior Publication Data

US 2013/0017677 A1    Jan. 17, 2013

Related U.S. Application Data

(60) Provisional application No. 61/508,315, filed on Jul. 15, 2011.

(30) Foreign Application Priority Data

Jul. 15, 2011   (JP) ................... 2011-156228

(51) Int. Cl.
*H01L 21/28* (2006.01)
*H01L 21/3205* (2006.01)
*H01L 21/44* (2006.01)
*H01L 21/4763* (2006.01)
*H01L 21/336* (2006.01)

(52) U.S. Cl.
USPC ........... 438/602; 438/688; 438/586; 438/597; 438/931; 438/285; 438/683; 438/685

(58) Field of Classification Search
USPC ......... 438/586, 597, 688, 931, 602, 604, 283, 438/683, 685; 257/77
See application file for complete search history.

(56) References Cited

U.S. PATENT DOCUMENTS

| | | | | |
|---|---|---|---|---|
| 5,124,779 | A * | 6/1992 | Furukawa et al. | 257/77 |
| 6,653,659 | B2 * | 11/2003 | Ryu et al. | 257/77 |
| 6,833,562 | B2 * | 12/2004 | Tanimoto et al. | 257/77 |
| 2004/0007766 | A1 | 1/2004 | Nakayama et al. | |
| 2004/0183080 | A1 * | 9/2004 | Kusumoto et al. | 257/77 |
| 2006/0267022 | A1 * | 11/2006 | Mizukami et al. | 257/77 |
| 2008/0203400 | A1 * | 8/2008 | Fukuda et al. | 257/77 |
| 2008/0203441 | A1 * | 8/2008 | Endo | 257/255 |
| 2008/0227256 | A1 * | 9/2008 | Tanimoto | 438/285 |
| 2009/0233435 | A1 * | 9/2009 | Kawahashi et al. | 438/602 |
| 2010/0055858 | A1 * | 3/2010 | Hayashi et al. | 438/285 |

(Continued)

FOREIGN PATENT DOCUMENTS

| | | |
|---|---|---|
| JP | 2-065138 A | 3/1990 |
| JP | 7-335873 A | 12/1995 |

(Continued)

*Primary Examiner* — Mary Wilczewski
*Assistant Examiner* — Erik T Peterson
(74) *Attorney, Agent, or Firm* — Venable LLP; Michael A. Sartori; Tamatane J. Aga

(57) ABSTRACT

A method for manufacturing a MOSFET includes the steps of: forming a gate oxide film on an active layer, forming a gate electrode on the gate oxide film, forming a source contact electrode in ohmic contact with the active layer, and forming an interlayer insulating film made of silicon dioxide so as to cover the gate electrode after the source contact electrode is formed. The step of forming a source contact electrode includes the steps of forming a metal layer including aluminum so as to be in contact with the active layer, and alloying the metal layer.

3 Claims, 7 Drawing Sheets

(56) References Cited

U.S. PATENT DOCUMENTS

| | | |
|---|---|---|
| 2010/0102332 A1* | 4/2010 | Takahashi et al. ............. 257/77 |
| 2010/0207125 A1* | 8/2010 | Uchida et al. .................. 257/77 |
| 2010/0244048 A1* | 9/2010 | Hayashi et al. ................ 257/77 |
| 2011/0031506 A1 | 2/2011 | Tamaso |
| 2011/0031507 A1 | 2/2011 | Tamaso |

FOREIGN PATENT DOCUMENTS

| | | |
|---|---|---|
| JP | 2004-096067 A | 3/2004 |
| JP | 2008-078434 A | 4/2008 |
| WO | WO-2009/128382 A1 | 10/2009 |
| WO | WO-2009/128419 A1 | 10/2009 |

* cited by examiner

METHOD FOR MANUFACTURING SEMICONDUCTOR DEVICE

BACKGROUND OF THE INVENTION

1. Field of the Invention

The present invention relates to a method for manufacturing a semiconductor device, and more particularly to a method for manufacturing a semiconductor device capable of preventing occurrence of a short circuit between an electrode including aluminum and a gate electrode when the electrode including aluminum and the gate electrode are arranged so as to sandwich an interlayer insulating film made of silicon dioxide therebetween.

2. Description of the Background Art

There is a case where electrodes such as a source electrode for a MOSFET (Metal Oxide Semiconductor Field Effect Transistor) or an emitter electrode for an IGBT (Insulated Gate Bipolar Transistor) is arranged adjacent to a gate electrode with an interlayer insulating film made of silicon dioxide therebetween. Also, there is a case where a metal film including aluminum (Al) is adopted as an electrode to provide a source electrode for a MOSFET or an emitter electrode for an IGBT. (For example, refer to WO2009/128382 (PTL 1) and WO2009/128419 (PTL 2).)

Herein, when an electrode including Al is adopted to provide a source electrode for a MOSFET or an emitter electrode for an IGBT with the above-described structure, a short-circuit may occur disadvantageously between the electrode including Al and the gate electrode.

SUMMARY OF THE INVENTION

The present invention was made to solve such a problem, and its object is to provide a method for manufacturing a semiconductor device capable of preventing occurrence of the short-circuit.

A method for manufacturing a semiconductor device according to the present invention includes the steps of forming a gate insulating film on a semiconductor layer, forming a gate electrode on the gate insulating film, forming an ohmic contact electrode in ohmic contact with the semiconductor layer, and forming an interlayer insulating film made of silicon dioxide so as to cover the gate electrode after the ohmic contact electrode is formed. The step of forming an ohmic contact electrode includes the steps of forming a metal layer including aluminum to be in contact with the semiconductor layer, and alloying the metal layer.

The inventors of the present invention conducted a detailed study on causes of the short-circuit and countermeasures with respect to the causes, and arrived at the present invention based on the finding set forth below.

Generally, in a method for manufacturing a semiconductor device having a gate electrode such as a MOSFET or an IGBT, a semiconductor layer serving as an active layer is formed, and thereafter an insulating film serving as a gate insulating film, a gate electrode provided on the insulating film, and an interlayer insulating film covering the gate electrode are formed sequentially. Then, a contact hole is formed so as to penetrate through the interlayer insulating film and the insulating film serving as a gate insulating film and reach the semiconductor layer. Thereafter, to provide a contact with the semiconductor layer exposed through the contact hole, an ohmic contact electrode such as a source electrode or an emitter electrode is formed in ohmic contact with the semiconductor layer. Here, if an ohmic contact electrode made of an alloy including Al is to be provided, a metal layer including Al is formed and thereafter heated to produce an alloy including Al, leading to formation of an ohmic contact electrode.

In the case of forming the ohmic contact electrode through such a procedure, when the metal layer is fabricated, a metal layer including Al is formed also at a wall surface of the interlayer insulating film constituting a side surface of the contact hole. Then, the subsequent heating for alloying allows Al included in the metal film to enter silicon dioxide constituting the interlayer insulating film, and the entered Al and the interlayer insulating film react with each other. As a result, the insulating function of the interlayer insulating film becomes insufficient, thereby possibly causing occurrence of a short-circuit between the gate electrode and the ohmic contact electrode.

On the other hand, in the method for manufacturing a semiconductor device according to the present invention, after an ohmic contact electrode including Al is formed, in other words, after heat treatment for alloying a metal film including Al is performed, an interlayer insulating film made of silicon carbide is formed so as to cover a gate electrode. Thus, adhesion of the metal film including Al to a wall surface of a contact hole subsequently formed in the interlayer insulating film can be avoided. As a result, reaction of Al with the interlayer insulating film is avoided at the time of alloying, thereby preventing occurrence of the short-circuit. According to the method for manufacturing a semiconductor device of the present invention, a method for manufacturing a semiconductor device capable of preventing occurrence of the short-circuit can be provided.

In the method for manufacturing a semiconductor device set forth above, the step of forming an ohmic contact electrode may further include the step of processing the metal layer by dry etching. Thus, the metal film can be shaped to obtain a desired shape of the ohmic contact electrode in a relatively easy manner in mass-production.

The method for manufacturing a semiconductor device may further include the step of forming an oxide layer at a surface layer portion of the gate electrode prior to the step of processing the metal layer by dry etching. Thus, at the time of applying dry etching to the metal film, the gate electrode formed ahead is prevented from being etched concurrently.

In the method for manufacturing a semiconductor device, the semiconductor layer may be made of silicon carbide. Adopting silicon carbide, being a wide band gap semiconductor, as a semiconductor material constituting a semiconductor device, the semiconductor device can have reduced on-resistance, a high breakdown voltage, and the like.

In the method for manufacturing a semiconductor device, the metal layer may include aluminum, titanium, and silicon. An electrode including aluminum, titanium, and silicon can be brought into low-resistance contact with a semiconductor layer made of silicon carbide having any of p-type conductivity and n-type conductivity. Thus, such an electrode is suitable for use as an ohmic contact electrode for a semiconductor device adopting silicon carbide as a semiconductor material.

As being clear from the description above, according to the method for manufacturing a semiconductor device of the present invention, a method for manufacturing a semiconductor device capable of preventing occurrence of a short-circuit between a gate electrode and an ohmic contact electrode can be provided even in a case where an ohmic contact electrode including Al is adopted.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
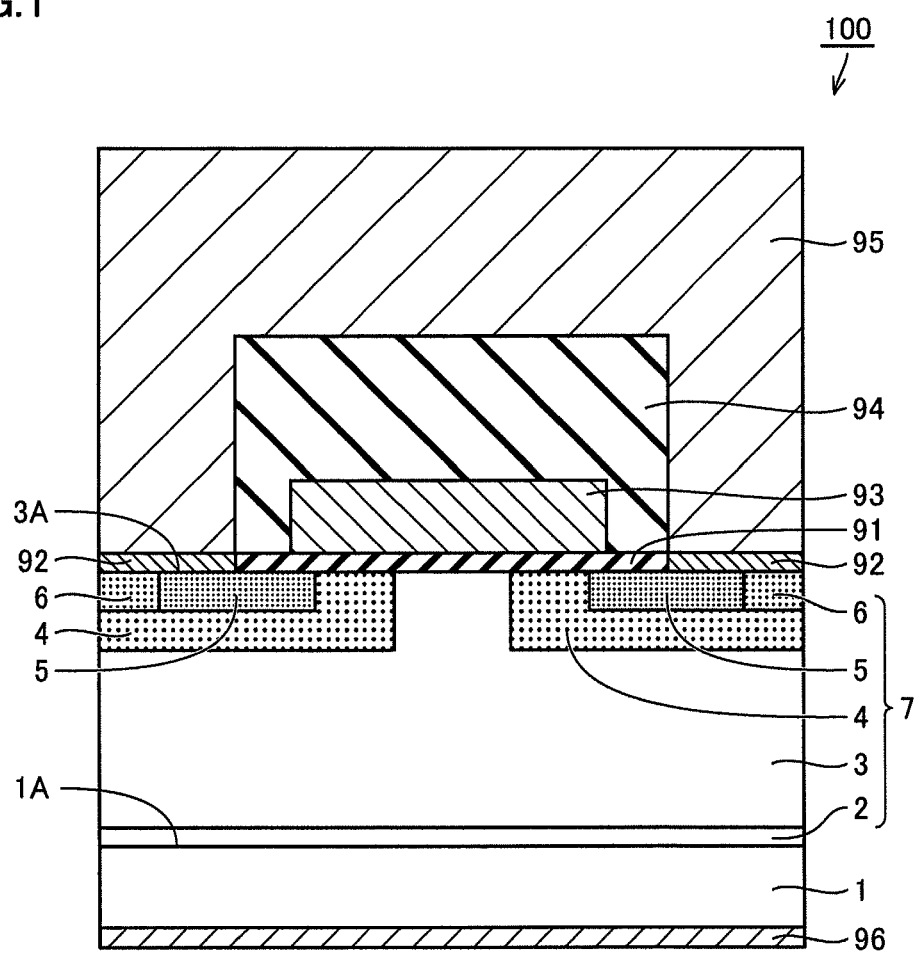
FIG. 1 is a schematic sectional view showing a structure of a MOSFET.

Hereinafter, an embodiment of the present invention will be described with reference to the drawings. In the drawings below, the same or corresponding elements have the same reference characters allotted, and description thereof will not be repeated.

Referring to FIG. 1, a MOSFET 100 as a semiconductor device (DiMOSFET) according to an embodiment of the present invention includes a silicon carbide substrate 1 having n-type conductivity (first conductivity type), a buffer layer 2 made of silicon carbide and having n-type conductivity, a drift layer 3 made of silicon carbide and having n-type conductivity, a pair of p-type body regions 4 each having p-type conductivity (second conductivity type), n$^+$ regions 5 each having n-type conductivity, and p$^+$ regions 6 having p-type conductivity.

Buffer layer 2 is formed on one main surface 1A of silicon carbide substrate 1 and includes n-type impurities to have n-type conductivity. Drift layer 3 is formed on buffer layer 2 and includes n-type impurities to have n-type conductivity. The n-type impurities included in drift layer 3 are, for example, N (nitrogen) and are included at a concentration (density) lower than that of the n-type impurities included in buffer layer 2. Buffer layer 2 and drift layer 3 are epitaxial growth layers formed on one main surface 1A of silicon carbide substrate 1.

P-type body regions 4 constituting a pair are formed separately from one another on the epitaxial growth layer so as to include a main surface 3A opposite to the main surface at the side of silicon carbide substrate 1. Each p-type body region 4 includes p-type impurities (impurities having p-type conductivity) to have p-type conductivity. The p-type impurities included in p-type body region 4 are, for example, aluminum (Al), boron (B), or the like.

N$^+$ regions 5 include main surface 3A and are formed in pair of p-type body regions 4 respectively so as to be surrounded by p-type body regions 4. Each n$^+$ region 5 includes n-type impurities such as P at a concentration (density) higher than that of the n-type impurities included in drift layer 3. P$^+$ regions 6 include main surface 3A and are formed adjacent to n$^+$ regions 5 and in pair of p-type body regions 4 respectively so as to be surrounded by p-type body regions 4. Each p$^+$ region 6 includes p-type impurities such as Al at a concentration (density) higher than the p-type impurities included in p-type body regions 4. Buffer layer 2, drift layer 3, p-type body regions 4, n$^+$ regions 5, and p$^+$ regions 6 constitute an active layer 7 as a semiconductor layer.

Referring to FIG. 1, MOSFET 100 further includes a gate oxide film 91 serving as a gate insulating film, a gate electrode 93, a pair of source contact electrodes 92 each serving as an ohmic contact electrode, an interlayer insulating film 94, a source interconnection 95, and a drain electrode 96.

Gate oxide film 91 is in contact with main surface 3A and is formed on main surface 3A of the epitaxial growth layer so as to extend from a location on the upper surface of one n$^+$ region 5 to a location on the upper surface of the other n$^+$ region 5. Gate oxide film 91 is made of, for example, silicon dioxide ($SiO_2$).

Gate electrode 93 is arranged in contact with gate oxide film 91 so as to extend from a location over one n$^+$ region 5 to a location over the other n$^+$ region 5. Moreover, gate electrode 93 is made of, for example, a conductor such as polysilicon having impurities doped.

Source contact electrodes 92 are so arranged as to extend from locations on pair of n$^+$ regions 5 in the directions away from gate oxide film 91 to reach locations on p$^+$ regions 6, and are arranged in contact with main surface 3A. Source contact electrodes 92 is made of a metal layer (alloy layer) including Al, for example, a metal layer (alloy layer) including Al, Ti (titanium), and Si (silicon), thereby making contact with both n$^+$ regions 5 and p$^+$ regions 6 at a low contact resistance, in other words, making ohmic contact. Herein, the contact resistance between source contact electrodes 92 and n$^+$ regions 5 is, for example, equal to or less than $1 \times 10^{-5}$ $\Omega cm^2$, and the contact resistance between source contact electrodes 92 and p$^+$ regions 6 is equal to or less than $1 \times 10^{-3}$ $\Omega cm^2$.

Interlayer insulating film 94 is formed so as to surround gate electrode 93 on main surface 3A of drift layer 3 and extend from a location over one p-type body region 4 to a location over the other p-type body region 4. Interlayer insulating film 94 is made of silicon dioxide ($SiO^2$) as an insulator.

Source interconnection 95 surrounds interlayer insulating film 94 on main surface 3A of drift layer 3 and extends to the upper surface of source contact electrodes 92. Further, source interconnection 95 is made of a conductor such as Al, and is electrically coupled to n$^+$ regions 5 through source contact electrodes 92.

Drain electrode 96 is formed in contact with a main surface of silicon carbide substrate 1 opposite to the side where drift layer 3 is formed. Drain electrode 96 is made of a material the same as the source contact electrodes 92 or material such as $Ni_xSi_y$, capable of making ohmic contact with silicon carbide substrate 1 and is electrically coupled to silicon carbide substrate 1.

Next, operations of MOSFET 100 will be described. Referring to FIG. 1, when the drain electrode is applied with a voltage while gate electrode 93 has a voltage smaller than a threshold voltage, in other words, during the off-state, a pn junction of p-type body regions 4 and drift layer 3 just below gate oxide film 91 has a reverse bias. Accordingly, MOSFET 100 is in the non-conductive state. On the other hand, when gate electrode 93 is applied with a voltage equal to or greater than the threshold voltage, an inversion layer is formed in a channel region of p-type body regions 4 in proximity to locations in contact with gate oxide film 91. As a result, n$^+$ regions 5 and drift layer 3 are electrically connected, whereby a current flows between source interconnection 95 and drain electrode 96.

Here, MOSFET 100 is provided with electrodes including Al, more specifically, electrodes including Al, Ti, and Si, as source contact electrodes 92. Thus, source contact electrodes 92 are in contact with n$^+$ regions 5 at a low contact resistance, and also in contact with p$^+$ regions 6 at a low contact resistance. As a result, in MOSFET 100, while a low on-resistance is ensured by a low contact resistance between source contact electrodes 92 and n$^+$ regions 5, the electrical potential of each p-type body region 4 is maintained more reliably by the low contact resistance between source contact electrodes 92 and p$^+$ regions 6. Since MOSFET 100 is manufactured by the method for manufacturing a semiconductor device according to the present embodiment described below, occurrence of a short-circuit between gate electrode 93 and source contact electrodes 92 is prevented.

Figure 2:
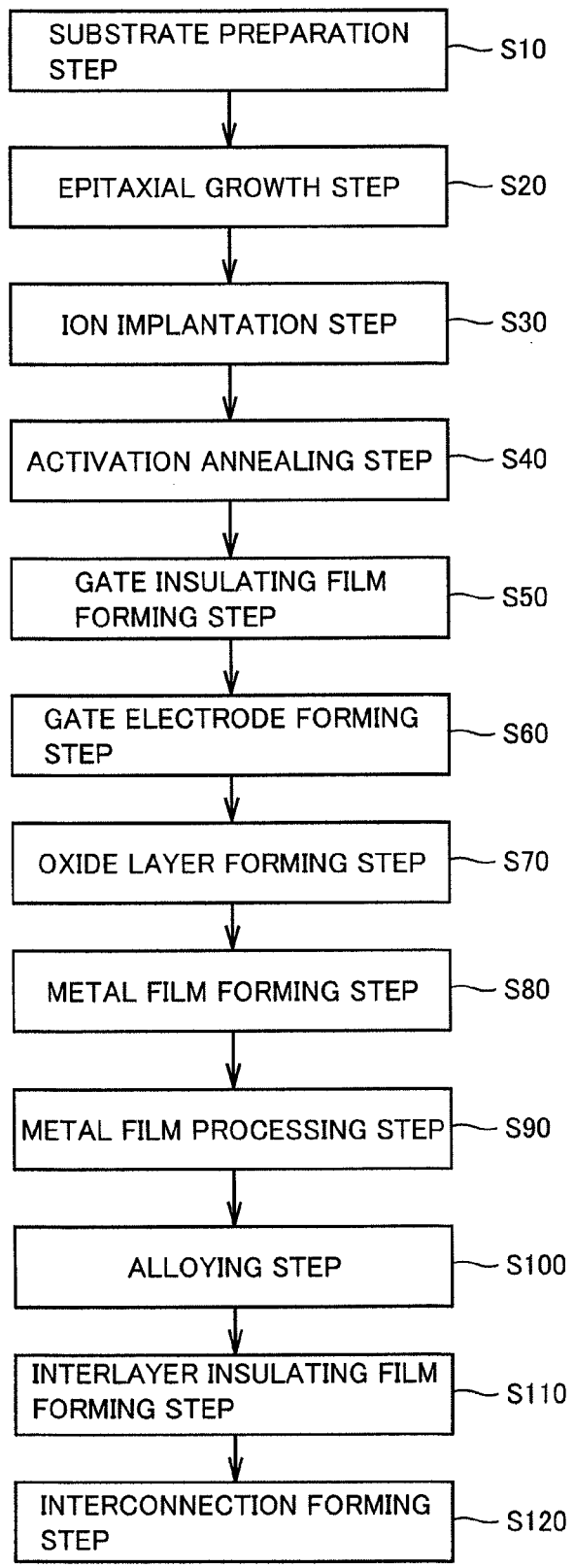
FIG. 2 is a flowchart schematically showing a method for manufacturing the MOSFET.
Figure 3:
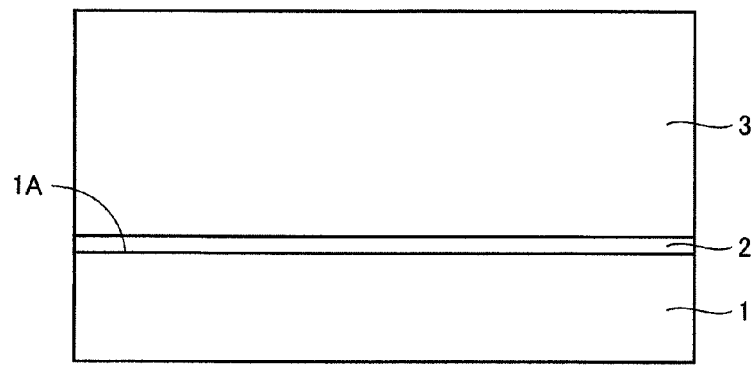
FIGS. 3 to 12 are schematic sectional views for describing a method for manufacturing the MOSFET.

Referring to FIG. 2, in the method for manufacturing MOSFET 100 as a semiconductor device according to the present embodiment, a substrate preparation step is first performed as a step S10. In this step S10, referring to FIG. 3, silicon carbide substrate 1 made of silicon carbide is prepared.

Next, as a step S20, an epitaxial growth step is performed. In this step S20, referring to FIG. 3, buffer layer 2 and drift layer 3 each made of silicon carbide are formed sequentially on one main surface 1A of silicon carbide substrate 1 by epitaxial growth.

Figure 4:
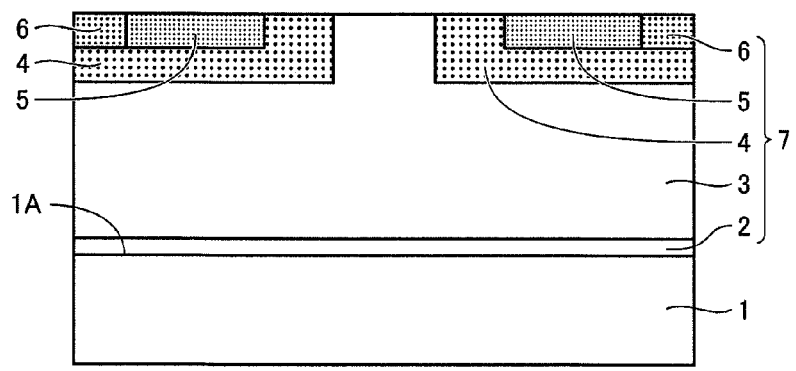

Next, as a step S30, an ion implantation step is performed. In this step S30, referring to FIG. 3 and FIG. 4, ion implantation is performed to form p-type body regions 4. Specifically, Al ions, for example, are implanted to drift layer 3, thereby forming p-type body regions 4. Next, ion implantation is performed to form $n^+$ regions 5. Specifically, P (phosphorus) ions, for example, are implanted to p-type body regions 4, thereby forming $n^+$ regions 5 in p-type body regions 4. Further, ion implantation is performed to form $p^+$ regions 6. Specifically, Al ions, for example, are implanted to p-type body regions 4, thereby forming $p^+$ regions 6 in p-type body regions 4. The ion implantation can be performed by forming a mask layer, made of silicon dioxide ($SiO_2$) and having openings at desired regions for ion implantation, on the main surface of drift layer 3.

Next, as a step S40, an activation annealing step is performed. In this step 40, for example, heat treatment is performed by heating to 1700° C. in an inert gas atmosphere such as argon for 30 minutes. Accordingly, the impurities introduced in the above-described step S30 are activated.

Figure 5:
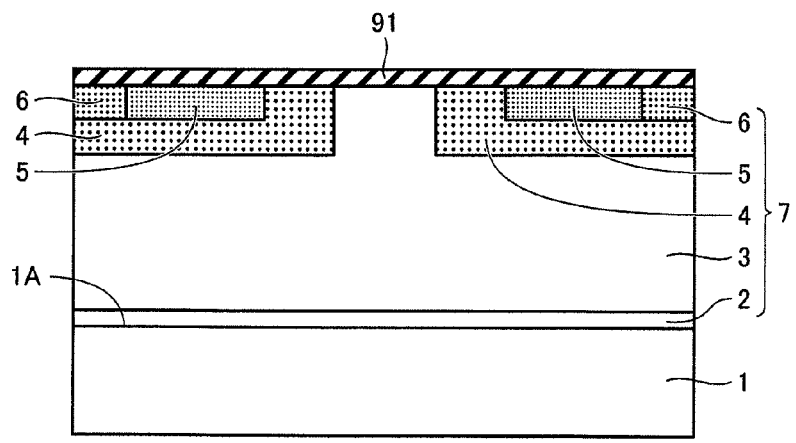

Next, as a step S50, a gate insulating film forming step is performed. In this step S50, referring to FIG. 4 and FIG. 5, for example, heat treatment is performed by heating to 1300° C. in an oxygen atmosphere for 60 minutes, thereby forming oxide film (gate oxide film) 91.

After this step S50, an NO annealing step may be performed. In this step, nitric monoxide (NO) gas is adopted as an atmosphere gas, and heat treatment is performed by heating in the atmosphere gas. The conditions for the heat treatment may include heating at a temperature equal to or greater than 1100° C. and equal to or less than 1300° C. for about 1 hour. Such heat treatment allows nitrogen atoms to be introduced into an interface region between oxide film 91 and drift layer 3. Thus, formation of an interface state at the interface region between oxide film 91 and drift layer 3 is prevented, thereby improving channel mobility of the eventually obtained MOSFET 100. The atmosphere gas is not limited to NO gas, and any other gas capable of introducing nitrogen atoms into the interface region between oxide film 91 and drift layer 3 may be used.

Further, after the NO annealing step, an Ar annealing step may be performed. In this step, argon (Ar) gas is adopted as an atmosphere gas, and heat treatment is performed by heating in the atmosphere gas. The conditions for the heat treatment may include, for example, heating at a temperature exceeding the heating temperature of the NO annealing step and less than the melting point of oxide film 91 for about an hour. By performing such heat treatment, formation of an interface state at the interface region between oxide film 91 and drift layer 3 can be further suppressed, so that channel mobility of the eventually obtained MOSFET 100 can be improved. The atmosphere gas is not limited to Ar gas, and any other inert gas such as nitrogen gas may be used alternatively.

Figure 6:
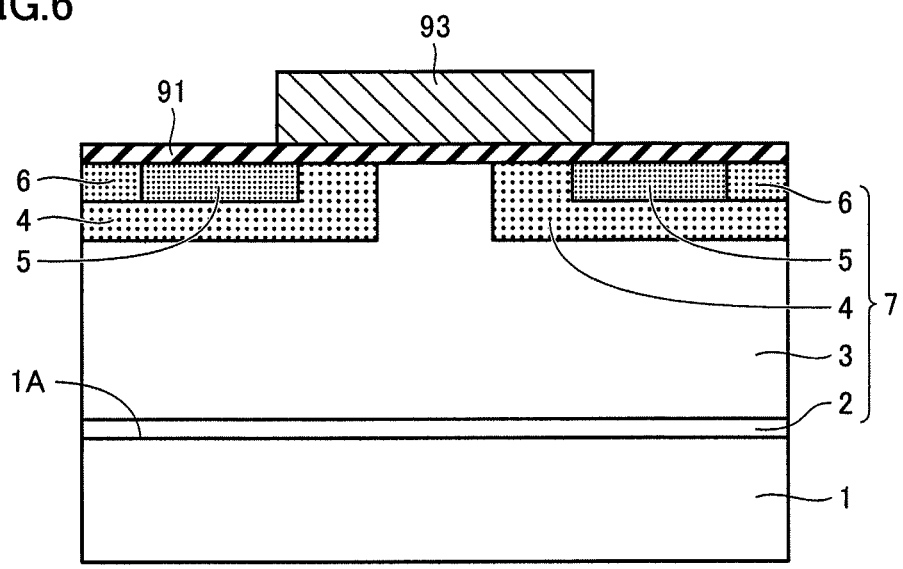

Next, as a step S60, a gate electrode forming step is performed. In this step S60, referring to FIG. 5 and FIG. 6, a polysilicon film as a conductor having impurities at a high density is formed first on oxide film 91, for example, using the CVD method. Next, a resist layer is formed on the polysilicon film, and then a mask layer is formed by photo-lithography, having openings at regions other than regions corresponding to desired shape of the gate electrode. Next, the mask layer is used as a mask to perform dry etching, and thereafter the mask layer is removed, thereby forming gate electrode 93 as shown in FIG. 6.

Figure 7:
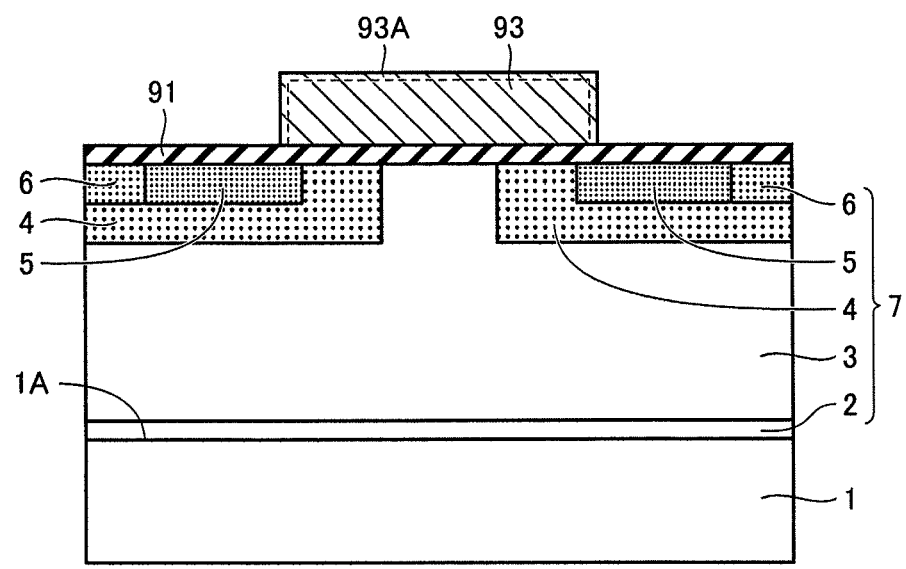

Next, as a step S70, an oxide layer forming step is performed. This step S70 is not a mandatory step. However, if a metal film is to be processed by dry etching in a step S90 described below, it is preferable to perform this step S70. Specifically, in step S70, the surface layer portion of gate electrode 93 made of polysilicon and formed in step S60 is oxidized, thereby forming oxide layer 93A as shown in FIG. 7. Oxide layer 93A can be formed by heat treatment of heating at a temperature equal to or greater than 800° C. and equal to or less than 1100° C. for 1 minute or longer and less than or equal to 60 minutes, for example, in an oxygen atmosphere.

Figure 8:
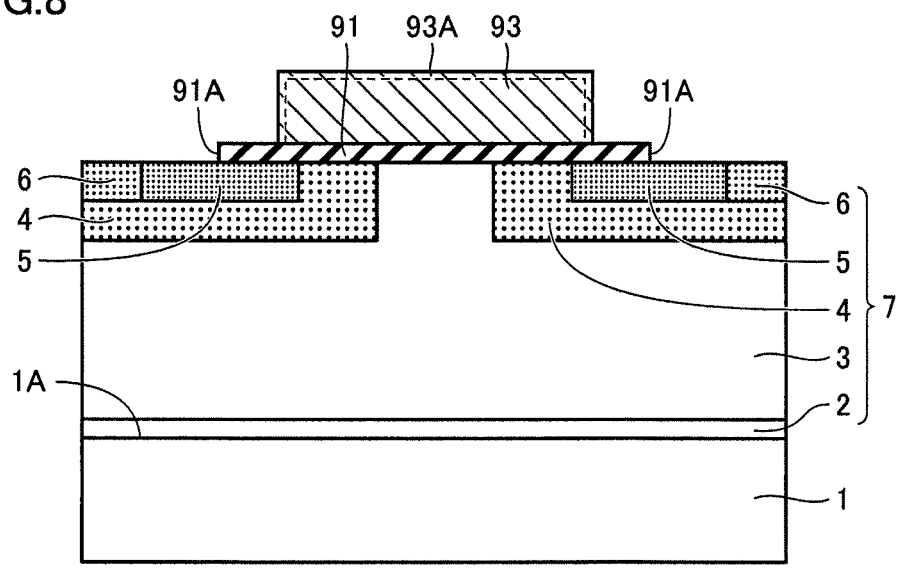
Figure 9:
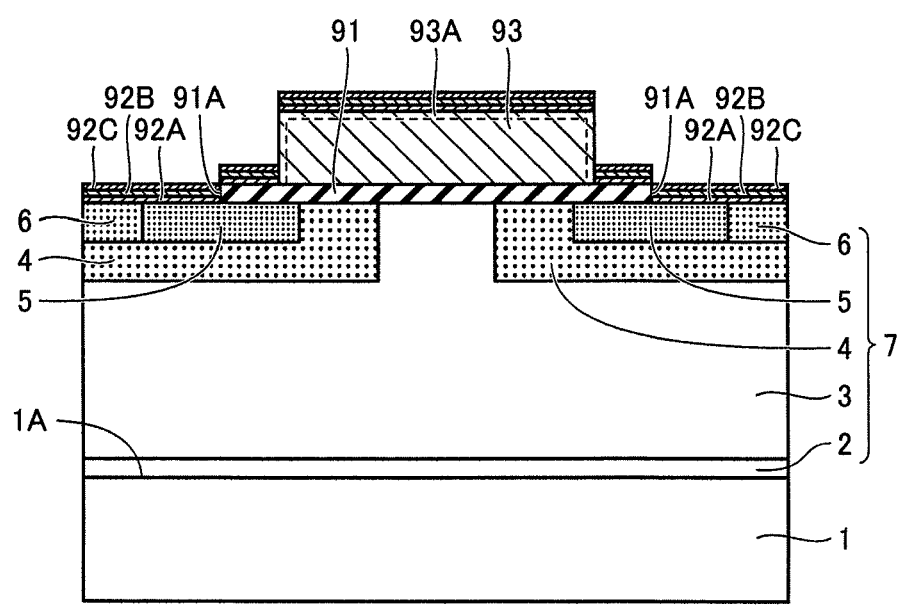

Next, as a step S80, a metal film forming step is performed. In this step S80, referring to FIG. 7 and FIG. 8, openings 91A are first formed in a region of oxide film 91 where source contact electrodes 92 (refer to FIG. 1) shall be formed. As a result, $n^+$ regions 5 and $p^+$ regions 6 are exposed through openings 91A. Openings 91A can be formed, for example, by forming a mask layer and performing dry etching. As a result of forming openings 91A, remaining oxide film 91 serves as gate oxide film 91 (refer to FIG. 1). Then, referring to FIG. 8 and FIG. 9, for example, by a deposition method, a metal film including a stack of layers in the overlying sequence of Ti layer 92A, Al layer 92B, and Si layer 92C is formed so as to cover locations over $n^+$ regions 5 and $p^+$ regions 6 exposed through the openings 91A, over oxide film 91, and over gate electrode 93.

Figure 10:
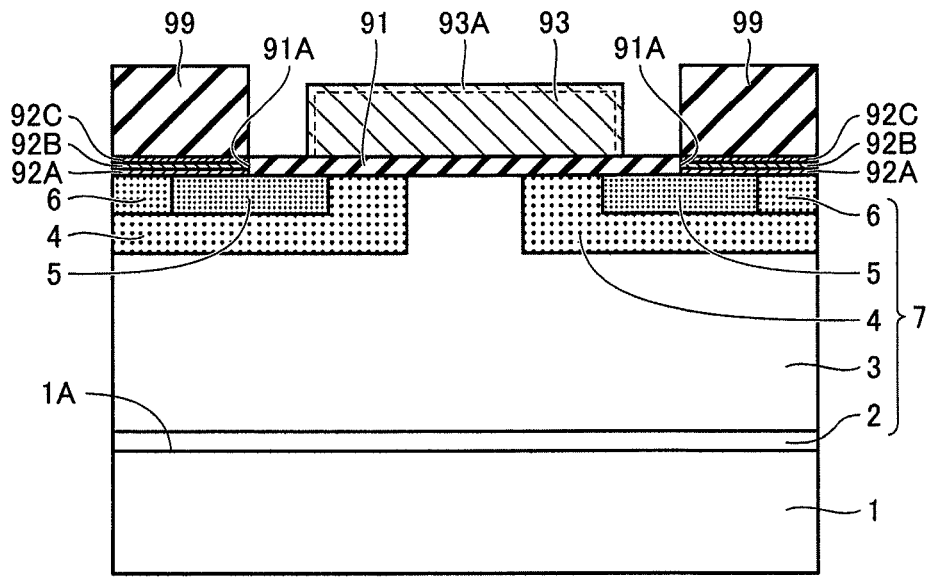

Next, as a step S90, a metal film processing step is performed. In, this step S90, referring to FIG. 9 and FIG. 10, resist layers 99 serving as a mask layer having openings at regions other than locations over $n^+$ regions 5 and $p^+$ regions 6 through openings 91A is formed by applying a resist and performing a photo-lithography. Then, dry etching is performed, whereby the metal film (Ti layer 92A, Al layer 92B, and Si layer 92C) formed in the regions other than the locations over $n^+$ regions 5 and $p^+$ regions 6 exposed through openings 91A is removed. At this stage, in the present embodiment, oxide layer 93A is formed in step S70, and oxide layer 93A serves as an etching stop layer, thereby suppressing a damage to gate electrode 93 caused by dry etching.

Figure 11:
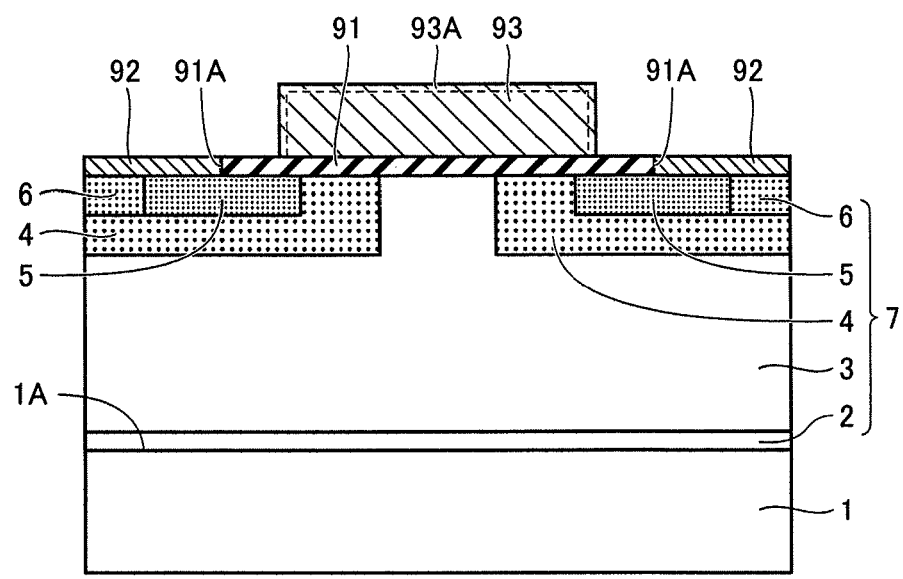

Next, as a step S100, an alloying step is performed. In this step S100, referring to FIG. 10 and FIG. 11, resist layers 99 are first removed, and thereafter heat treatment is performed by heating at a temperature equal to or greater than 850° C. and equal to or less than 1150° C. for less than or equal to 10 minutes, for example, in an atmosphere of an inert gas such as Ar. Thus, Ti, Al, and Si included in Ti layer 92A, Al layer 92B, and Si layer 92C constituting the metal film, and C included in $n^+$ regions 5 and $p^+$ regions 6 are alloyed, thereby forming source contact electrodes 92.

Figure 12:
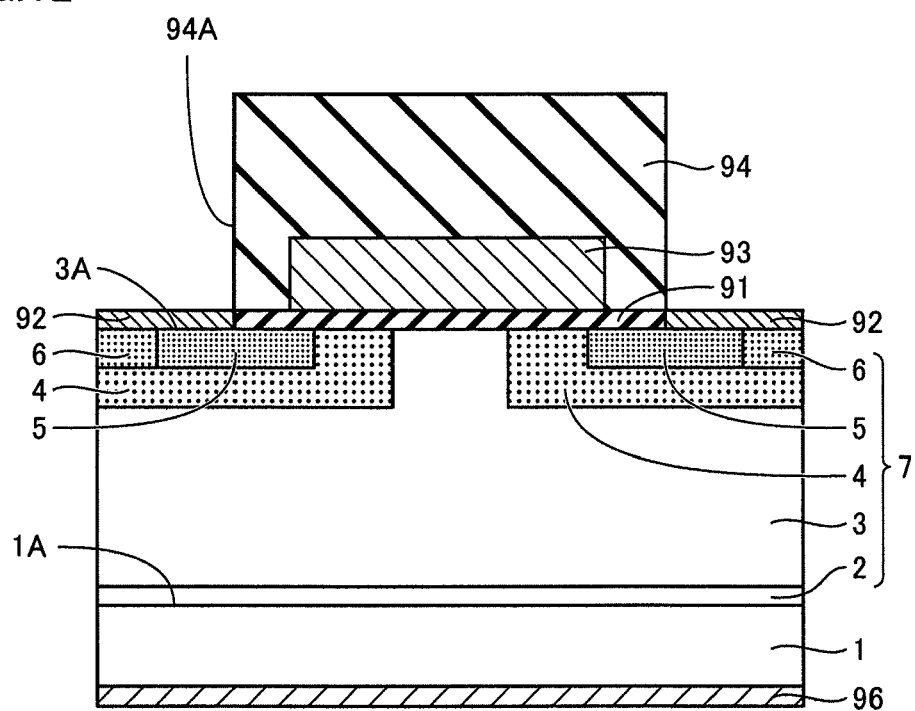

Moreover, a drain electrode 96 in ohmic contact with silicon carbide substrate 1 is formed to be brought into contact with a main surface of silicon carbide substrate 1 at the side opposite to the side where buffer layer 2 is located (refer to FIG. 12). Likewise with source contact electrodes 92, drain electrode 96 may be formed by the process of alloying after Ti layer 92A, Al layer 92B, and Si layer 92C are formed on silicon carbide substrate 1, or may be formed by performing alloying heat treatment of silicidizing an Ni (nickel) film after the Ni film is formed on silicon carbide substrate 1.

Next, as a step S110, an interlayer insulating film forming step is performed. In this step S110, referring to FIG. 11 and FIG. 12, interlayer insulating film 94 made of silicon carbide ($SiO^2$) serving as an insulating body is formed so as to cover source contact electrodes 92, gate oxide film 91, and gate electrode 93, for example, by a CVD method. Then, a region of interlayer insulating film 94 covering source contact electrode is removed, for example, by dry etching, thereby forming a contact hole 94A penetrating through interlayer insulating film 94. As a result, interlayer insulating film 94 is shaped so as to surround gate electrode 93 on gate oxide film 91.

Next, as a step S120, an interconnection forming step is performed. In this step S120, for example, a metal film made of Al is formed by a deposition method to cover interlayer insulating film 94, and contact hole 94A is filled, thereby forming source interconnection 95 coupled to source contact electrodes 92. MOSFET 100 according to the present embodiment is completed by the procedure described above.

In a generally used method for manufacturing a MOSFET, referring to FIG. 12, source contact electrodes 92 are formed after contact hole 94A is formed. Therefore, when a metal layer including Al is formed by the deposition method like the above-described step (S80), metal including Al adheres also to the wall surface of contact hole 94A. Then, heating for alloying in a subsequent step S100 allows Al included in the metal to enter interlayer insulating film 94 and react with interlayer insulating film 94. As a result, the insulating function of interlayer insulating film 94 may become insufficient, whereby causing occurrence of a short-circuit between gate electrode 93 and source contact electrodes 92.

On the other hand, according to the method for manufacturing MOSFET 100 of the present embodiment, a step S110 of forming an interlayer insulating film is performed after step S80 of forming a metal film including Al and step S100 of alloying the metal film are performed. Therefore, adhesion of metal including Al to the wall surface of contact hole 94A formed in interlayer insulating film 94 and entering of Al into interlayer insulating film 94 are avoided. Thus, occurrence of the short-circuit can be prevented. As described, with the method for manufacturing a semiconductor device according to the present embodiment, occurrence of a short-circuit between gate electrode 93 and source contact electrodes 92 can be prevented.

In steps S80 to S90 set forth above, the process of forming a metal film (Ti layer 92A, Al layer 92B, and Si layer 92C) and thereafter processing the metal film by dry etching has been described. Alternatively, a metal film having a desired shape may be formed by providing a resist layer having a desired pattern, forming a metal film, and performing a lifting-off process. In such a case, step S70 can be omitted.

Further in the above-described embodiment, the case of sequentially forming Ti layer 92A, Al layer 92B, and Si layer 92C has been explained. Alternatively, a single-layered metal film including Ti, Al, and Si may be formed.

Furthermore, in the above-described embodiment, the case of adopting a silicon carbide substrate as a semiconductor substrate and forming a semiconductor layer made of silicon carbide on the substrate has been described. However, as a semiconductor constituting the semiconductor substrate and the semiconductor layer, various semiconductors such as silicon, GaN (gallium nitride) can be adopted in place of silicon carbide. Further, in the above-described embodiment, the MOSFET has been explained as an example of a semiconductor device. However, a semiconductor device applicable with the method for manufacturing a semiconductor device according to the present invention is not limited to such a MOSFET. For example, the method for manufacturing a semiconductor device according to the present invention can be applied also to other various semiconductor devices, such as an IGBT, including Al sandwiching an interlayer insulating film near a gate electrode.

The method for manufacturing a semiconductor device according to the present invention is advantageously applicable to manufacturing a semiconductor device formed with having another electrode including Al formed in the proximity of a gate electrode with an interlayer insulating film therebetween.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A method for manufacturing a semiconductor device, comprising the steps of:
    forming a gate insulating film on a semiconductor layer;
    forming a gate electrode on said gate insulating film;
    forming an ohmic contact electrode in ohmic contact with said semiconductor layer; and
    forming an interlayer insulating film made of silicon dioxide so as to cover said gate electrode after said ohmic contact electrode is formed,
    wherein said step of forming the ohmic contact electrode includes the steps of
    forming a metal layer including aluminum so as to be in contact with said semiconductor layer;
    processing said metal layer by a dry etching; and
    alloying said metal layer,
    wherein an oxide layer is formed on a surface layer portion of said gate electrode by oxidizing said surface layer portion prior to the step of processing said metal layer by the dry etching.

2. The method for manufacturing a semiconductor device according to claim 1, wherein said semiconductor layer is made of silicon carbide.

3. The method for manufacturing a semiconductor device according to claim 2, wherein said metal layer includes aluminum, titanium, and silicon.

* * * * *